(12) United States Patent
Autillo et al.

(10) Patent No.: US 11,594,434 B2
(45) Date of Patent: Feb. 28, 2023

(54) DEVICE FOR COLLECTING CONTAMINANTS ON THE EDGES AND THE BEVEL OF A CIRCULAR PLATE

(71) Applicant: COMMISSARIAT A L'ENERGIE ATOMIQUE ET AUX ENERGIES ALTERNATIVES, Paris (FR)

(72) Inventors: Delphine Autillo, Grenoble (FR);
Thomas Bordy, Grenoble (FR);
Delphine Boutry, Grenoble (FR);
Virginie Enyedi, Grenoble (FR);
Thierry Flahaut, Grenoble (FR);
Herve Fontaine, Grenoble (FR);
Roland Garcia-Santana, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 588 days.

(21) Appl. No.: 16/719,598

(22) Filed: Dec. 18, 2019

(65) Prior Publication Data
US 2020/0203190 A1 Jun. 25, 2020

(30) Foreign Application Priority Data
Dec. 19, 2018 (FR) .................................. 18 73425

(51) Int. Cl.
*H01L 21/67* (2006.01)
*F26B 5/08* (2006.01)
(Continued)

(52) U.S. Cl.
CPC ............ *H01L 21/6715* (2013.01); *F26B 5/08* (2013.01); *G01N 21/94* (2013.01);
(Continued)

(58) Field of Classification Search
CPC .. H01L 21/6715; H01L 21/67288; F26B 5/08; G01N 21/94; G01N 21/9501;
(Continued)

(56) References Cited

U.S. PATENT DOCUMENTS

2016/0178279 A1    6/2016   Velazquez et al.

OTHER PUBLICATIONS

"Novel Technique for Contamination Analysis around the Edge, the Bevel, and the Edge Exclusion Area of 200 and 300mm Silicon Wafers", Chris M. Sparks', Carolyn F. H. Gondran, Patrick S. Lysaght, and John T. Donahue. SPIE vol. 5041 (2003) (Year: 2003).*

(Continued)

*Primary Examiner* — Jamil Ahmed
(74) *Attorney, Agent, or Firm* — Oblon, McClelland, Maier & Neustadt, L.L.P.

(57) ABSTRACT

Collection device for collecting elements on at least one bevel of a circular plate, comprising:
a base comprising a collection groove intended to receive a collection liquid,
a plate-carrier able to rotate the plate about itself and such that an outer periphery of the plate penetrates into the collection groove,
wherein the collection device comprises means for visualising the interior of the collection groove, enabling at least one image to be acquired of the contact region between the collection liquid and a face of the plate.

19 Claims, 6 Drawing Sheets

(51) Int. Cl.
    *G06T 7/00*     (2017.01)
    *G01N 21/95*     (2006.01)
    *G01N 21/94*     (2006.01)
    *B08B 3/14*     (2006.01)
    *B08B 15/04*     (2006.01)

(52) U.S. Cl.
    CPC ....... *G01N 21/9501* (2013.01); *G06T 7/0004* (2013.01); *H01L 21/67288* (2013.01); *B08B 3/14* (2013.01); *B08B 15/04* (2013.01); *G06T 2207/30148* (2013.01)

(58) Field of Classification Search
    CPC ......... G06T 7/0004; G06T 2207/30148; B08B 3/14; B08B 15/04
    See application file for complete search history.

(56) References Cited

OTHER PUBLICATIONS

U.S. Appl. No. 16/494,049, filed Mar. 13, 2018, Unknown.
French Preliminary Search Report dated Nov. 27, 2019 in French Application 18 73425 filed on Dec. 19, 2018 (with English Translation of Categories of Cited Documents), 3 pages.
Chris M. Sparks et al., "Novel technique for Contamination Analysis around the Edge, the Bevel, and the Edge Exclusion Area of 200 and 300 mm Silicon Wafers", Proceedings of SPIE, vol. 5041, Jul. 15, 2003, pp. 99-104.

* cited by examiner

DEVICE FOR COLLECTING CONTAMINANTS ON THE EDGES AND THE BEVEL OF A CIRCULAR PLATE

TECHNICAL FIELD AND PRIOR ART

The present invention relates to a device for liquid collection of contaminants on the edge and the rim of circular plates, for example on substrates used in microelectronics, in particular with the aim of identifying and quantifying contaminants, and a method for liquid collection of contaminants.

It is very important to be able to identify and quantify traces of contaminant metal elements present on a substrate or plate in the field of microelectronics, because these traces reduce electrical performance. This contamination can occur at each manufacturing step of electronic circuits on a substrate, for example a silicon substrate. The contamination may be due to the state of cleanliness of a piece of equipment and occur on the rear face and/or on the front face. The contamination on the rear face or on the bevel can also be due to the devices used for manipulating the substrates, for example grippers, or the equipment used to transfer the substrates from one box to another, referred to as "sorter", or even due to the substrate storage boxes.

Various techniques exist for analysing the edge of the substrate. One technique is based on total reflection X-ray fluorescence (TXRF) spectrometry, enabling 0 mm of analysis exclusion with respect to the edge of the plate. Another technique involves collection by a liquid droplet, and analysis of this droplet by inductively coupled plasma mass spectrometry or ICP-MS. This technique is known as vapour phase decomposition—droplet collection—inductively coupled plasma mass spectrometry (VPD-DC-ICPMS). The collection of the contaminants consists of two steps. The first step is a step of decomposing the native oxide on the surface of the plate using hydrofluoric acid vapour making the surface hydrophobic. The second step is the collection of contaminants by circulating a chemical droplet on the surface of the silicon plate.

Various configurations have been developed for this technique, allowing contaminants to be collected either in the region of the rim, also called the bevel, or on the bevel and on the edge of the plate over a height of approximately 4-5 mm. It is difficult to reduce this height due to the risk of losing the droplet in the apparatus and not being able to analyse the contamination. In any case, there are no means available for inspecting or measuring the regions of the substrate actually collected and analysed, the wetted region being dependent on the condition of the surface (roughness, chemical nature of the surface or state of contamination). However, knowledge of this surface is important since it is desired to correlate the concentration of metals analysed by ICPMS with the collection surface area in order to provide the results in at/cm$^2$.

The document "*Novel technique for contamination analysis around the edge, the bevel, and the edge exclusion area of 200 and 300 mm silicon wafers*". Proceedings of SPIE 5041, *Process and Materials Characterization and Diagnostics in IC manufacturing* (15 Jul. 2003), Chris M. Sparks et al., 2003, pp. 99-104, doi: 10.1117/12.485233 describes a device for collecting plate edge contaminants, comprising a support on which the substrate is mounted capable of rotating about a horizontal axis, and a gutter containing a collection liquid and receiving a portion of the edge of the plate. By rotating the plate about itself, the entire plate edge is swept by the liquid in the gutter. However, the height of the contact surface of the liquid with the plate edge is not precisely known, it can vary due to the hydrophilic/hydrophobic properties of the plate. In addition, the device used does not allow a collection to be carried out over the entire periphery of the substrate.

DISCLOSURE OF THE INVENTION

It is therefore an aim of the present invention to provide a device for collecting elements located either on the bevel of a circular plate, or on the edges and on the bevel of a circular plate, making it possible for the surface area of collection to be precisely known.

The above stated aim is achieved by a device for collecting elements located on the bevel, or on the edges and the bevel, of a circular plate. It comprises a support for the plate such that the plate can rotate about its axis of rotation, a groove intended to contain a collection liquid, the groove being located with respect to the support so that at least the bevel or a portion of the edges of the two faces and the bevel of the plate, penetrate into the groove and come into contact with the collection liquid. The device also comprises means for visualising the contact region between the liquid and the plate. The images of the contact region provided by the visualisation means then make it possible to measure the height of contact between the collection liquid and at least one plate edge and to precisely determine the surface area over which the collection has taken place and thus to calculate the concentration of elements collected. By means of the invention, by reducing the contact height between the liquid and the substrate, it is possible to carry out a collection on the bevel of the substrate only.

The visualisation means are, for example, at least one camera which provides an image of the contact region in real time. The speed of rotation of the substrate can then be adjusted in real time depending on the wetting/dewetting of the edge or edges of the substrate by the liquid.

In other words, the collection device makes it possible to acquire images of the collection region and therefore to know the actual surface area of this collection region.

Advantageously, lighting means are provided for the contact region. The lighting means are preferably disposed so as to light the collection region from above.

In addition, the collection device can be easily adjusted to different diameters of wafers on which the collection takes place.

Preferably, the bottom of the groove comprises a flat portion making it possible to locate the liquid at the bottom of the gutter.

The subject-matter of the present invention then is a device for collecting elements on at least one bevel of a circular plate, comprising:
  a base comprising a collection groove intended to receive a collection liquid,
  a plate-carrier able to rotate the plate about itself and such that the outer periphery of the plate penetrates into the collection groove,
  means for visualising the interior of the collection groove, enabling at least one image to be acquired of the contact region between the collection liquid and at least one of the two faces of the plate.

Another subject-matter of the present invention is a collection system comprising a collection device according to the invention and a processing unit configured to control the penetration position of the plate into the collection groove, the speed of rotation and the rotation, and configured to process images provided by the visualisation means in order to determine a collection surface area.

Another subject-matter of the present invention is a collection method using the collection device according to the invention, comprising:

A): placing the plate on the plate-carrier,

B): placing the collection liquid in the collection groove,

C): placing the plate-carrier so that the plate penetrates into the collection liquid to a given depth, D): rotating the plate at a suitable constant speed over at least one complete revolution, and acquiring images of the collection, E): withdrawing the plate, and F): recovering the collection liquid.

Another subject-matter of the present invention is a method for establishing at least one chart of the collection height using the device according to the invention, based on the penetration depth of the plate into the groove and of the volume of the collection liquid, comprising A') a step in which a calibration plate having the surface condition properties of the wafers on which it is desired to collect the elements, having the same diameter as those wafers and comprising graduations extending radially at least from the outer edge of the calibration plate, is mounted on the plate-carrier, the steps of B'): placing the collection liquid in the collection groove, C'): placing the plate-carrier carrying the calibration plate so that the plate penetrates into the collection liquid to a given penetration depth, and D'): acquiring images, then repeating steps C' and D' while modifying the penetration depth of the calibration plate into the collection groove, E') determining the collection height and calculating the collection surface area for the various penetration depths, F') establishing a chart connecting the penetration depth with the volume of the collection liquid at the collection surface.

Another subject-matter of the present invention is a method for determining the concentration per unit surface area of metallic contaminants of a plate, using the collection method according to the invention, and comprising processing the images acquired in step D to determine the collection surface area, analysing the collection droplet and calculating the surface concentration of contaminants of the plate.

BRIEF DESCRIPTION OF THE FIGURES

The present invention will be better understood on the basis of the following description and the attached drawings, in which.

DETAILED DISCLOSURE OF THE PARTICULAR EMBODIMENTS

In the description which follows, "substrate" means a plate in the shape of a disc. The substrate may also be referred to as a "plate" in the description which follows.

"Plate edge" or "edge" shall mean a region located at the radial outer extremity of the disc and extending over the entire circumference of the disc, the edge has an annular shape centred on the axis of rotation of the disc. The substrate comprises two faces, and one edge per face.

The bevel is the side of the plate connecting the two edges. The bevel can be rotationally cylindrical or frusto-conical, designated as a "bevel".

In the present application, "collection at least on the bevel of the plate" shall mean collection on the bevel, or on the bevel and the edges, of a plate.

The collection device which will be described below is suitable for collecting elements on the bevel, or on the edges and the bevel, of a substrate or plate in the shape of a disc. The elements shall be designated as contaminants.

The substrate considered in the description is a silicon substrate used in the manufacture of microelectronic devices; however, the invention applies to the collection of elements on any disc-shaped substrate, whether or not intended for the microelectronics industry.

Figure 1A:
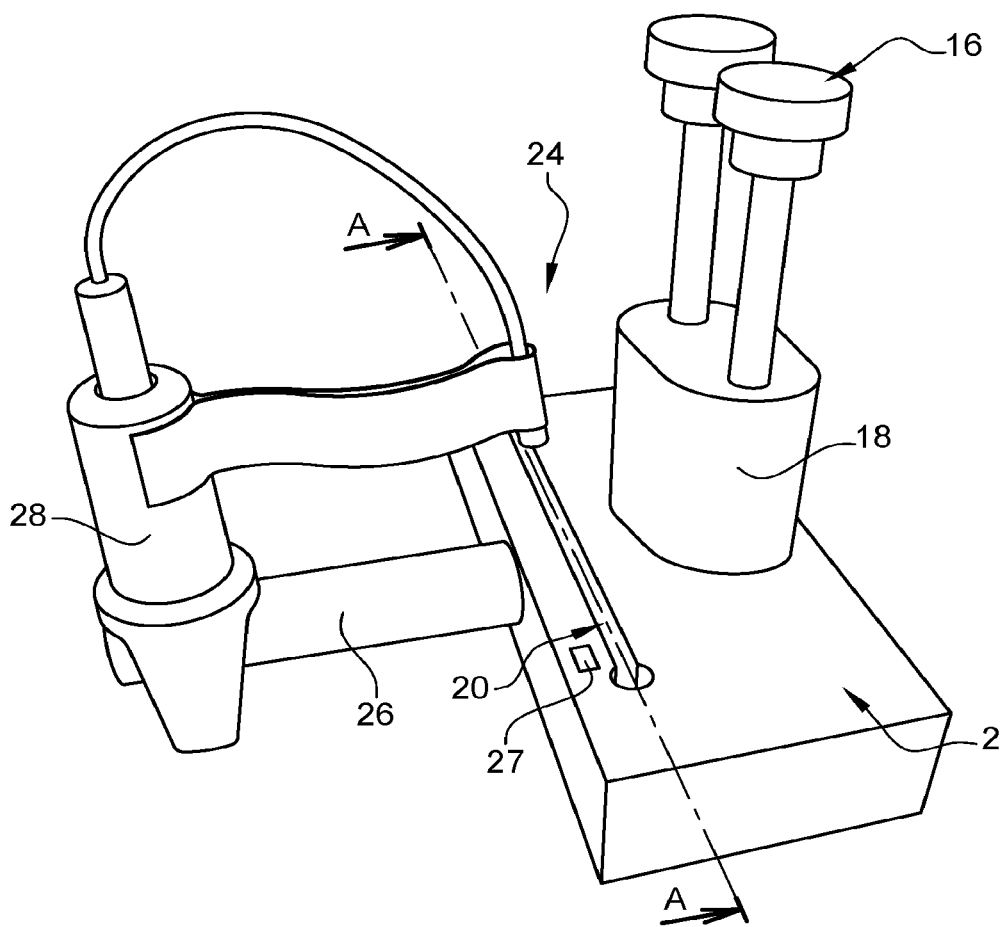
FIGS. 1A to 1C are various perspective views of an exemplary device for collecting contaminants on a plate.
Figure 1D:
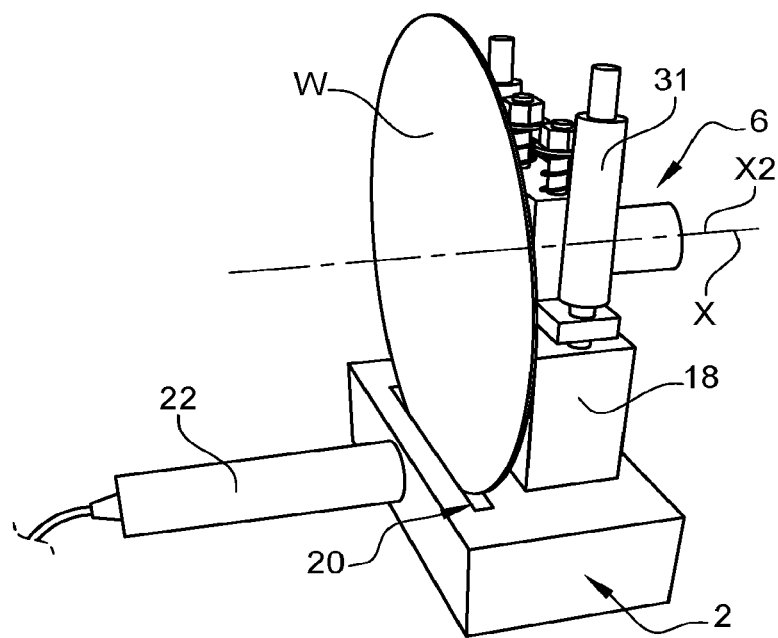
FIG. 1D is a perspective view of an embodiment of the device of FIGS. 1A to 1C, using micrometer screws.
Figure 1B:
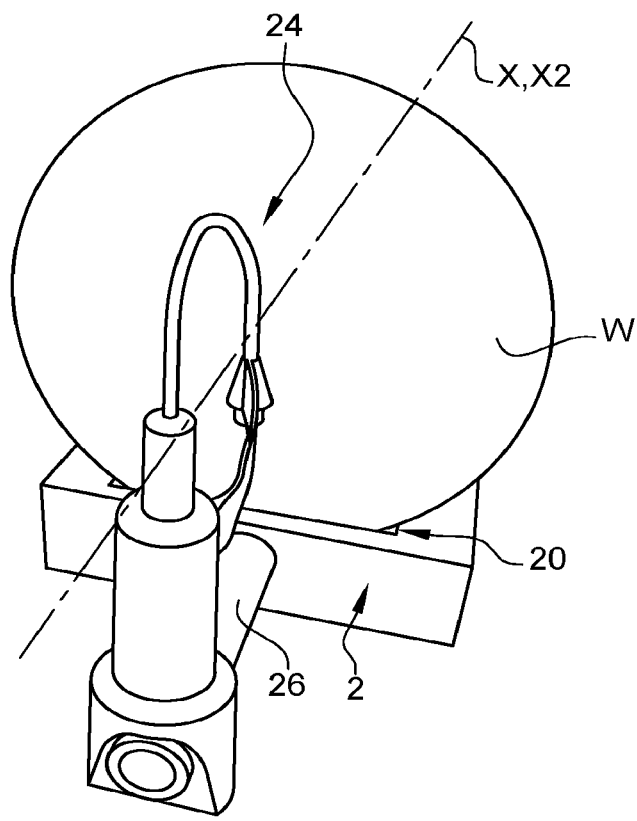
Figure 1C:
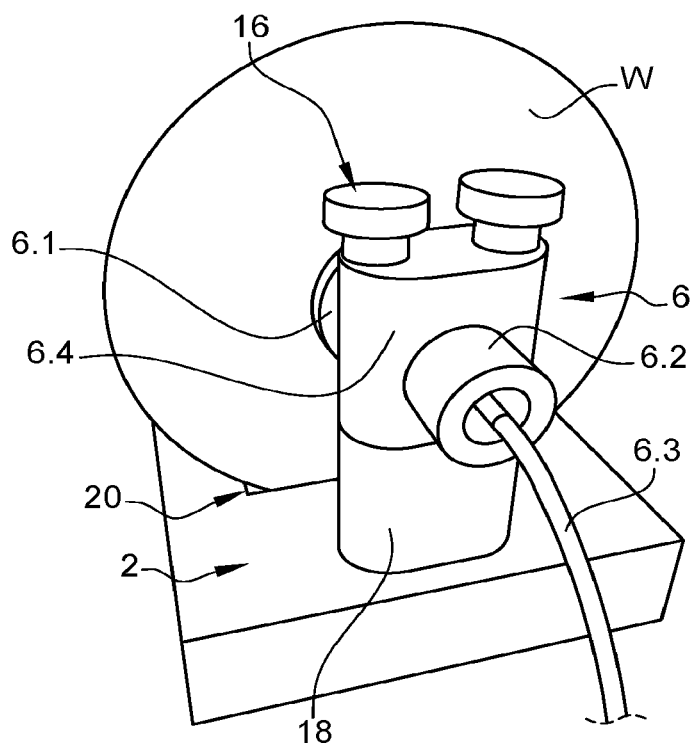

FIGS. 1A to 1C show an exemplary embodiment of the device for collecting contaminants on a substrate W with axis of revolution X. The collection device comprises a frame comprising a base 2 and a substrate-carrier or plate-carrier 6.

In the shown example, the substrate-carrier 6 is configured to hold the substrate W so that its axis X is horizontal, and allow the substrate W to be rotated about its axis X over at least 360°. The substrate-carrier 6 is intended to form an axis of rotation of the substrate. It preferably comprises means for holding the substrate, the means using vacuum. The substrate-carrier 6 is intended to be secured to a face of the substrate, coaxially with the axis X.

Figure 2:
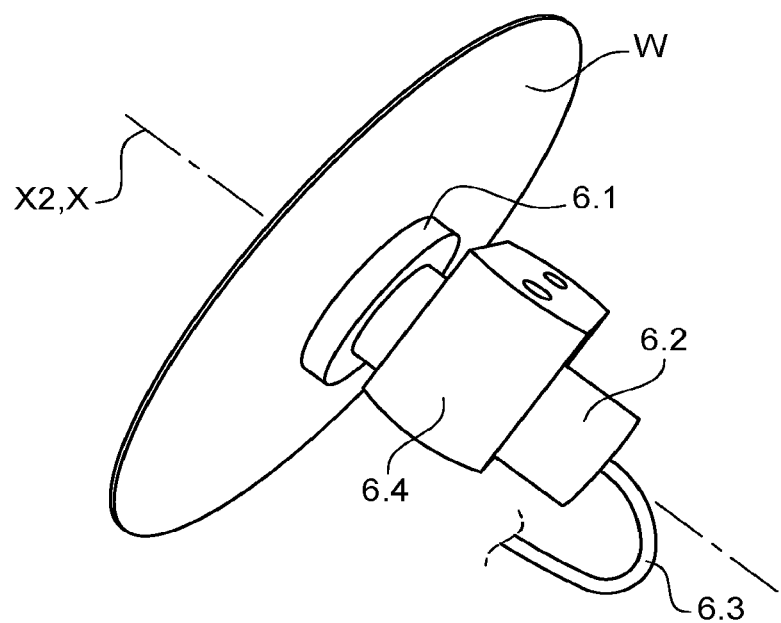
FIG. 2 is a perspective illustration of the substrate support and a plate.

The substrate-carrier comprises a support plate 6.1 disposed at the longitudinal end of a handle 6.2. The plate 6.1 is intended to be in contact with a face of the substrate, and the handle 6.2 is intended for the manipulation of the substrate holder. The substrate-carrier 6 comprises vacuum holding means for holding the substrate, for which purpose holes (not shown) are formed in the plate 6.1 and are connected via the handle 6.2 to a vacuum generation device by means of a tube 6.3. FIG. 2 shows a plate W rigidly attached to the substrate-carrier 6.

The base 2 also comprises means for attaching the substrate-carrier 6 to the frame, such that the axis X2 of the substrate-carrier 6 is horizontal.

In the example shown in FIG. 1A, the attachment means comprise two screws 16 that are vertically orientated and screwed into a protrusion 18 of the base 2 and intended to each pass through a bore produced in the mounting element 6.4 of the substrate-carrier 6. In order to install the mounting support on the base, the screws are withdrawn, the mounting element 6.4 is disposed on the protrusion 18 aligning the bores of the mounting element 6.4 with the screw holes of the protrusion, then the screws are replaced each passing through a bore (FIG. 1C). The mounting element is thus secured to the base, the axis X2 of the handle being orientated horizontally, as well as the axis X. The handle can then rotate freely about its axis with respect to the base 2.

The attachment by screws ensures that the substrate-carrier 6 and the substrate W are held and prevents any tilting. In addition, when the substrate-carrier is placed on the base, the substrate W is approached vertically and enters into the groove, and the risk of damage is reduced.

In the shown example, the substrate-carrier 6 is removable from the base 2.

During a collection, the substrate-carrier and the substrate are rotated with respect to the base. This rotation can be obtained manually by action of the hand on the substrate-carrier 6. According to an advantageous embodiment, means 19 (shown schematically in FIG. 4B) comprising an electric motor are used. For example, the substrate-carrier 6 is mounted directly altron the shaft of the electric motor or via a reduction gear, the motor being fixed on the chassis. The use of an electric motor facilitates control of the speed of rotation in order that it is constant throughout the collection. In addition, the speed of rotation can be easily changed, depending on the surface condition of the substrate and/or the diameter of the substrate. The motor is advantageously controlled by a control and processing unit U, for example a computer.

The base 2 comprises a collection groove 20 opening on the upper face of the base 2 and disposed, with respect of the protrusion 18, such that the edges and the bevel the substrate W penetrate into the collection groove 20. Preferably, at least the collection groove 20 is made of a material which interacts only slightly or not at all with the collection liquid, for example PTFE. In the shown example, the base is made of PTFE and the collection groove is machined therein.

More preferably, the entire device is made of the same material, for example PTFE.

The distance between the axis X2 and the bottom of the collection groove 20 is selected so that the bevel of the substrate does not come into contact with the bottom of the groove.

Figure 1E:
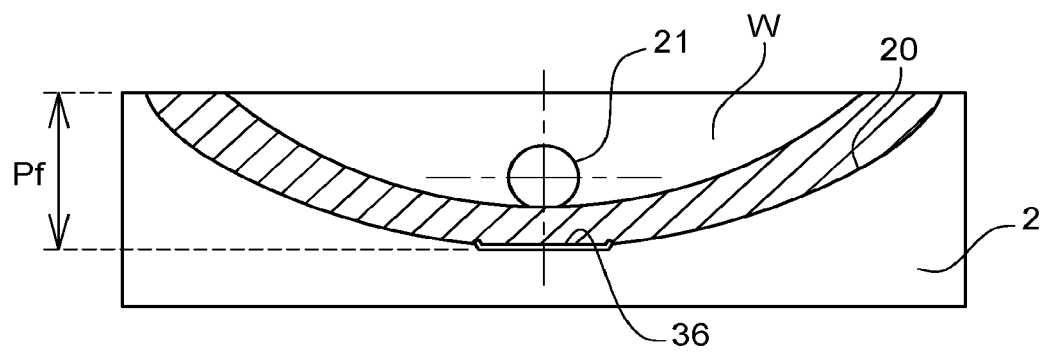
FIG. 1E is a longitudinal sectional view of the device of FIG. 1A, along the plane A-A.
Figure 3:
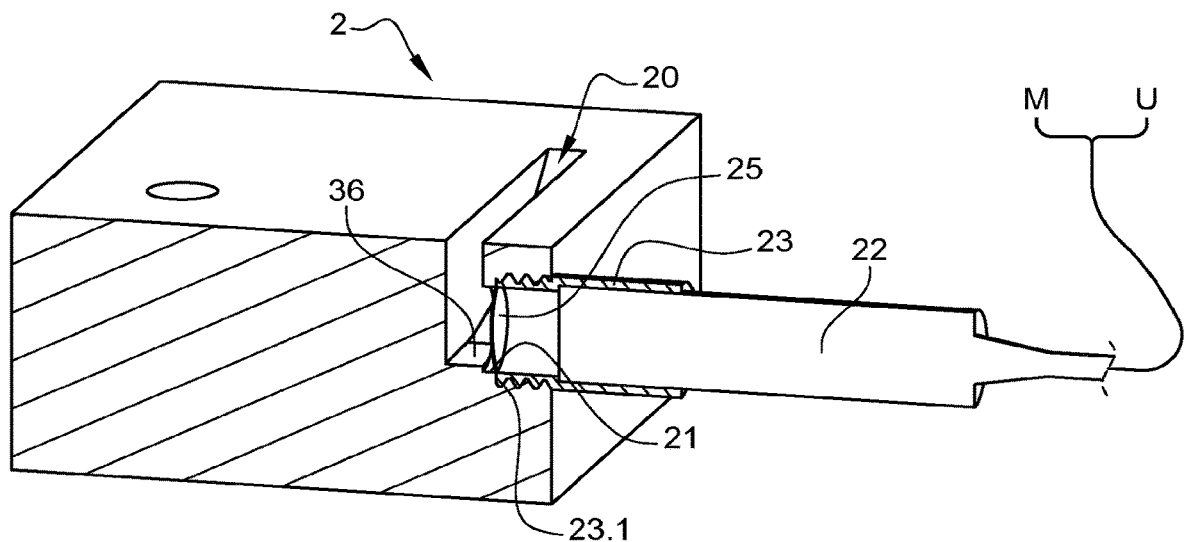
FIG. 3 is a sectional view of an exemplary base of a collection device.

The collection groove 20 has, for example, a curved bottom of diameter at least equal to the diameter of the largest plate intended to be placed in the collection device. For example, the groove has a width of approximately 6 mm and a maximum depth Pf of approximately 29 mm. As a variant, the groove can have a low depth just sufficient for placing the collection droplet. FIGS. 1E and 3 show a sectional view of the base, showing the curved bottom of the collection groove.

The quantity of collection liquid used is very low. It involves one droplet, for example of volume between 100 μl and 500 μl. Highly advantageously, the bottom of the groove 20 comprises means for retaining the droplet in the bottom of the groove, preferably in a centred position, in order to prevent it being carried away by the rotating substrate. The retaining means 36 are, for example, a change in curvature of the bottom of the groove (FIGS. 3 and 1E) with, for example, a flat bottom of sufficient dimensions to accommodate the droplet.

The collection device comprises means 22 for visualising the interior of the collection groove 20 at the contact region between the collection liquid and the substrate. The visualisation means are disposed so as to allow visualisation of the collection liquid in contact with at least one of the faces of the substrate.

In this example, the visualisation means are disposed so as to visualise the front face of the substrate.

The visualisation means advantageously comprise a camera mounted in the base so that its lens opens opposite the contact region.

In the shown example, the base 2 comprises a bore 21 opening into the collection groove 20 and orientated so that the lens of the camera is parallel to the axis X. Advantageously, means are provided for securing the camera in the bore 21; for example this may involve a sleeve 23 mounted by a press fit around the lens of the camera and clamped in the bore 21. Advantageously, this sleeve 23 ensures a sealed mounting. Other means of securing are possible, for example by snap fastening. The visualisation means are protected from the liquid. For example, the end 23.1 of the sleeve 23 mounted in the bore 21 and via which the image capture takes place, is preferably closed by transparent sealing means in order to allow the image capture. In the shown example, a disc 25 made of transparent material, for example from a transparent polymer such as perfluoroalkoxy polymer or PFA, is clamped between the end 23.1 of the sleeve 23 and the bottom of the bore 21 opening into the groove.

The use of a camera allows the entire collection step to be filmed.

Preferably, the camera is connected to a monitor M, allowing the collection to be visualised in real time, and to the control and processing unit U.

As a variant, the visualisation means comprise a still camera which takes a series of photographs during the collection step.

The collection device preferably comprises illumination means 24 for illuminating the collection region. These are preferably disposed so as to light the collection groove 20 from above. The illumination means comprise, for example, one or more light-emitting diodes, this having the advantage of not heating the collection region.

Highly advantageously, the illumination means are orientable, which enables the direction of the emitted light to be modified.

In the shown example, the collection device comprises a camera support 26 incorporating a support 28 for the illumination means.

As a variant, the collection device comprises means for visualising the front face and the rear face of the substrate. For this purpose, a second camera or a second still camera is mounted in a mounting bore produced in the base under the protrusion 18, on which the substrate-carrier 6 is mounted. As a variant, it is possible to dispose the visualisation means so as to visualise the rear face only.

Advantageously, the collection device comprises means for adjusting the vertical position of the substrate support 6, and therefore that of the substrate, in order to modify the penetration depth of the substrate W into the collection groove 20 and thus to modify the coverage height between the liquid and the front and rear faces of the substrate W and/or to adapt to different diameters of the substrate.

Figure 4A:
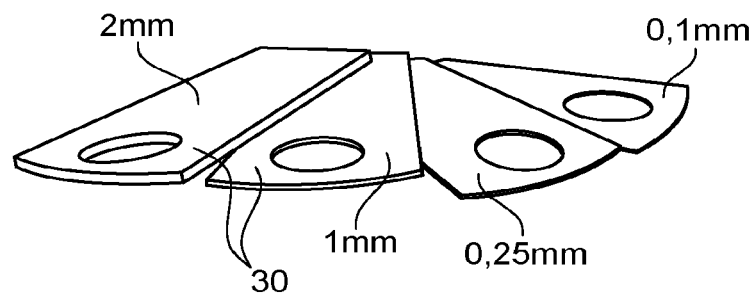
FIG. 4A is a perspective view of exemplary shims that can be used in the collection device.
Figure 4B:
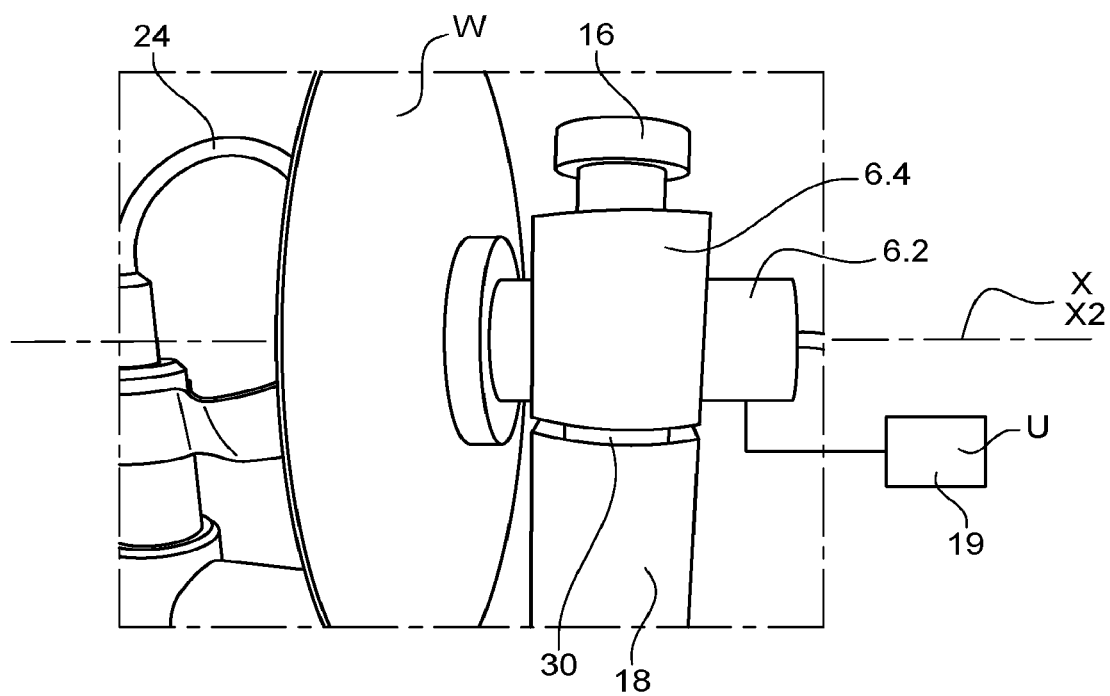
FIG. 4B is a perspective view of a detail of the collection device of FIGS. 1A to 1C equipped with all the shims of FIG. 4A.

The adjustment means comprise, for example, shims 30 of various thicknesses configured to be inserted between the protrusion 18 of the base and the substrate support 6, shown in FIG. 4A. The thicker the inserted shim, the larger the distance between the axis X2 of the substrate-carrier and the base 2. For example, the shims have a thickness between 0.1 mm and 2 mm. A plurality of shims of the same thickness and/or of different thicknesses can be stacked. FIG. 4B shows a shim 30 mounted between the protrusion 18 and the substrate-carrier 6.

FIG. 1D shows an embodiment in which the adjustment means are micrometer screw adjustment means 31 with manual or controlled action. Such adjustment means allow a finer adjustment than with shims.

By reducing the coverage height, it is possible to collect on the bevel only. In addition, with the images provided by the visualisation means, it is possible to check whether this is actually the case and to validate or not the collection.

The collection device is preferably adjusted to carry out collections on wafers of different diameters, for example between 100 mm and 300 mm.

As described below, depending on the hydrophilic properties of the substrate, the collection droplet tends to spread over the face of the substrate. In an embodiment, the collection device comprises means 27 suitable for delivering a controlled gas flow at the collection region, directed opposite to the wetting of the edge of the plate by the collection solution, in order to contain the analysis region. The gas flow is opposed to the capillary forces. The gas used is preferably an inert gas, for example nitrogen, in order not to modify the chemical properties of the droplet. For example, the gas flow rate is between 0.1 l/min and 5 l/min.

Preferably, before using the device according to the invention in order to carry out collections, a series of measurements is performed of the wetting and dewetting height in order to construct charts of wetting and dewetting height based on the diameter of the substrate and the volume of the droplet. In order to do this, so-called calibration substrates are used which have the same dimensions, and preferably the same surface condition, as the substrates to be analysed.

The calibration substrate is, for example, a silicon substrate with native oxide.

The mounting of the calibration substrate and the substrates for which it is desired to perform the collection can be made as follows.

First, the substrate-carrier 6 is mounted on the base in its lowest position, i.e. without adjustment shim, in the case of a device with adjustment shim, or by adjusting the micrometer screw so that the substrate-carrier is in its lowest position, in the case of a device with micrometer screw.

The plate is then disposed in the groove using a vacuum pipette. Due to the presence of the substrate-carrier 6, the plate is held in position substantially vertical. The plate touches the bottom of the groove but the groove will have been conditioned beforehand, avoiding any risk of additional contamination due to this contact.

The substrate-carrier 6 is then secured to the plate by suction. In this position, the substrate-carrier is secured to the centre of the plate so that the axes X and X2 are coaxial.

The substrate-carrier 6 and the plate are raised in order to allow the placing of the droplet.

As a variant, in order to limit the contact between the plate and the groove, two shims are placed at the ends of the groove 20, on which the plate can rest, reducing the contact area between the plate and an outer element. These shims should be conditioned beforehand.

It is considered, in the present application, that the surface condition of a face of a plate is defined by at least the degree of roughness of the face and the composition of the face. For example, when it is desired to analyse silicon substrates with native oxide, a silicon substrate with native oxide is used as calibration substrate.

Figure 5:
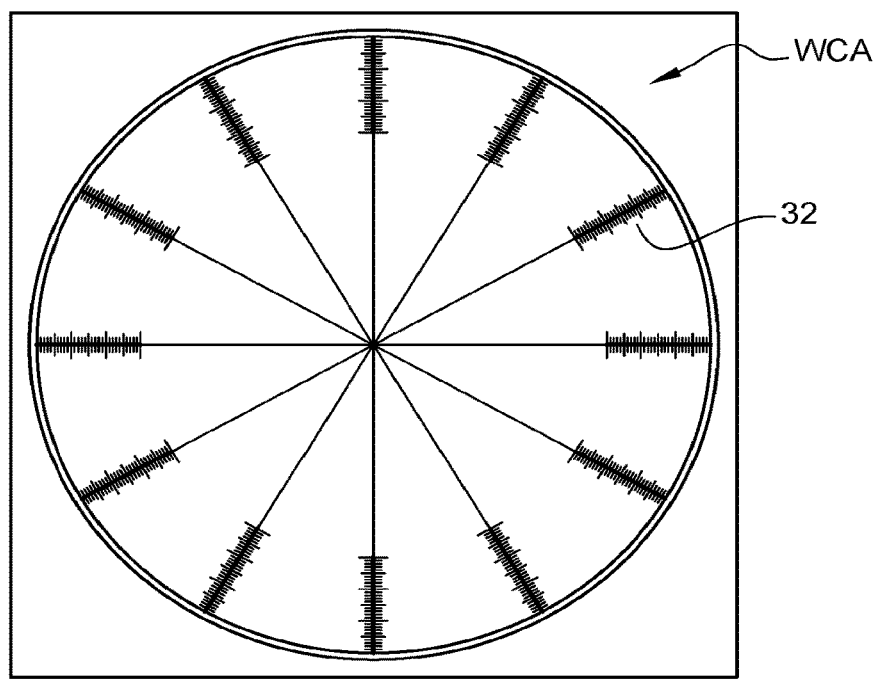
FIG. 5 is a face view of a calibration substrate which can be used for the calibration of the collection device.

Then, on at least one of the two faces, graduations are produced extending radially from the outside of the substrate, thus allowing, when the calibration substrate is in the collection groove, direct measurement via the camera of the contact height between the droplet and the front face. FIG. 5 shows an example calibration plate WCA on which the graduations 32 are disposed at 30° from one another and extend over a height of 3 cm from the outside of the plate, with a step of 0.1 mm.

As a variant, in the case of a device comprising means for visualising the front and rear faces, a disc can be used which comprises graduations on its front and rear faces in order to measure the wetting height on the two faces simultaneously. As a variant, the substrate is turned around so that its rear face faces the camera.

For example, in order to produce a calibration substrate, lithography/etching steps are performed. For example, in a first step, a lithography mask is produced comprising the pattern of graduations and their location. Then, in a second step, an etching of the silicon substrate having the dimensions and surface condition of the wafers to be analysed is carried out by lithography and etching This graduated substrate is placed in the device, a collection liquid droplet is disposed in the groove and the wetting height and dewetting height are visualised, which are measured using the graduations. The graduated substrate is not rotated.

These measurements are repeated with various volumes of droplet and various penetration depths of the substrate into the groove. The wetting and dewetting heights for different penetration depths and different droplet volumes are thus combined, which makes it possible to construct charts which are used to select the operating conditions.

The step of producing charts comprises the mounting of the calibration plate on the substrate-carrier 6 and the mounting of the substrate-carrier on the base 2 and the placing of the collection liquid in the collection groove 20.

The visualisation means are activated.

The substrate is then rotated.

In the case of silicon with native oxide, the faces of the substrate have hydrophilic properties. The collection liquid is selected in order to decompose the native oxide. As a result, the faces of the substrate in contact with the collection liquid become hydrophobic. During a first phase, called the wetting phase, the droplet "spreads" over the face of the substrate due to its hydrophilic nature. Then, during a second phase, called the dewetting phase, when the native oxide has been decomposed, the droplet shrinks. Through the visualisation of images of the contact between the collection liquid and at least one of the faces of the calibration substrate, the height of the droplet in the wetting phase and the height of the droplet in the dewetting phase are measured. The passage from the wetting phase to the dewetting phase is of order 10 seconds for a native oxide. The speed of rotation of the substrate is selected depending on the duration of the passage from the wetting phase to the dewetting phase.

Figure 7:
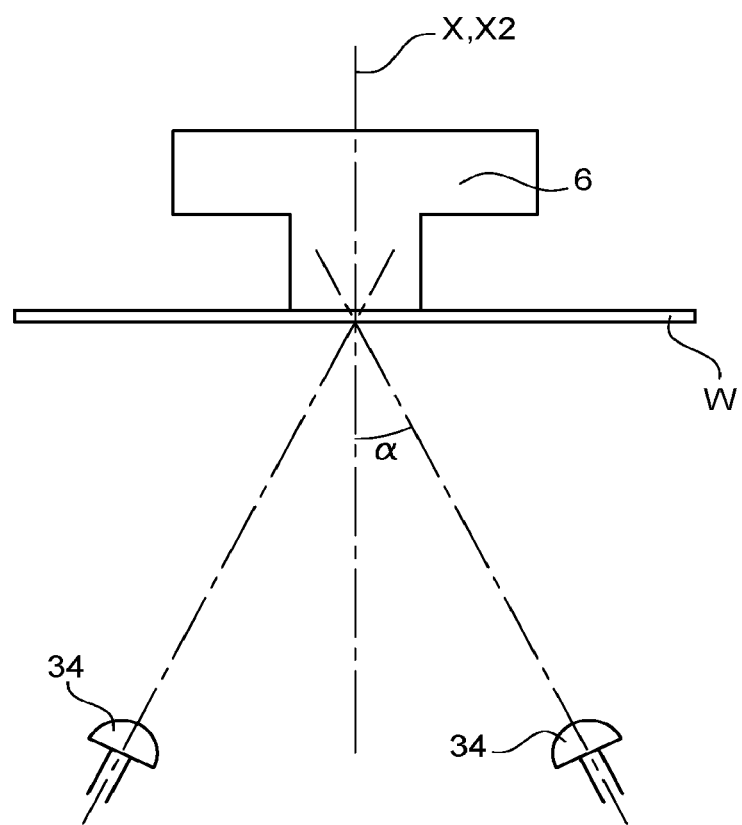
FIG. 7 is a schematic illustration of a view from above of a substrate and an illumination means suitable for the calibration step.

Highly advantageously, when the graduations are not contrasted with respect to the plate, it is preferable to light the graduated calibration plate using one or more light sources 34 (FIG. 7). Preferably, the light source 34 is orientated so as to be facing the face of the substrate bearing the graduations and such that its axis is inclined with respect to the face of the substrate, advantageously at an angle $\alpha$ between 5° and 15°. This makes it possible to obtain an optimum contrast between the silicon and the graduations. The light source or sources comprise, for example, one or more light-emitting diodes disposed in a ring.

In the case where the etchings are contrasted with respect to the material of the plate, lighting can be omitted.

As a variant, an image of the graduation is produced which is superimposed on an image of the droplet on the plate. It is then not necessary to use a graduated substrate.

Table T1 below lists the wetting and dewetting height measurements, as well as the collected surface area, based on the total height of added shims, for a 200 mm substrate made of silicon with native oxide and a 2000 droplet.

The collection liquid is a mixture of hydrofluoric acid and hydrogen peroxyde. This makes it possible to collect non-noble metals.

TABLE T1

LPD bevel standard metals HF/H$_2$O$_2$

| Plate type | Plate size | Droplet volume | Shim height | Wetting | Dewetting | Collected surface area |
|---|---|---|---|---|---|---|
| Graduated Si native oxide | 200 mm | 200 μL | 0 | 5.1 mm | 3.1 mm | 37.25 cm$^2$ |
| | | | 1 mm | 5 mm | 2.5 mm | 36.64 cm$^2$ |
| | | | 2 mm | 3.7 mm | 1.4 mm | 28.65 cm$^2$ |
| | | | 3 mm | 2.3 mm | bevel | 19.98 cm$^2$ |
| | | | 3.25 mm | 2.3 mm | bevel | 19.98 cm$^2$ |
| | | | 3.35 mm | 2.2 mm | bevel | 19.36 cm$^2$ |
| | | | 3.4 mm | | no contact | |

These measurements are made with an uncertainty of 0.1 mm.

From this table, the operator can choose the height of shim to be added based on the desired collection surface area. When the device is equipped with micrometer screws, a chart can be produced comprising the adjustment of the screws corresponding to the collected surface area, the operator then adjusts the micrometer screws according to the indicated adjustment.

During the calibration, the most suitable speed of rotation can be determined. More specifically, this is chosen so that the droplet is already in contact with the plate at the start of the dewetting stage, i.e. when the deoxidation of the contact region is completed. In addition, the speed of rotation is also selected so as not to lose the collection liquid.

The collected surface area comprises the surface area swept by the droplet on the front face, the surface area swept by the droplet on the rear face and the surface area of the bevel.

Figure 6:
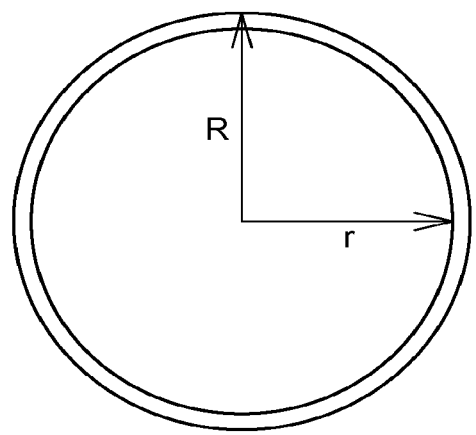
FIG. 6 is a face view of a substrate on which the collection region is shown.

If the collected height is different for the rear face and the front face, then $$S=\pi[R^2-r^2]+\pi[R^2-r'^2]+2\pi Rh \quad (II)$$

where R=outer radius, r and r'=inner radii for the front face and rear face respectively and h=height of the bevel of the plate (FIG. 6).

If the collection is only made on the bevel, then $S=2\pi Rh$

The inner radius is calculated by taking the difference between the outer radius and the height of the collection region. The collected height corresponds to the wetting height that is defined by the camera and image processing system.

In the case where the collected surface area on the rear face is identical to that on the front face, $S=2\pi[R^2-r^2]+2\pi Rh$ (I).

The collection method, using the collection device described above, will now be described.

The method may involve the following steps:

a) placing and securing the graduated calibration plate on the substrate support as described above, b) placing the calibration plate on the base, with the desired shim height selected, c) switching on the visualisation means and optionally the illumination means and adjusting the visualisation means in order to have an image of the calibration substrate, d) capturing an image of the calibration substrate and removing the calibration substrate, e) advantageously, conditioning the collection groove with the collection liquid, and advantageously conditioning a pipette tip used for the sampling of the solution intended to form the collection droplet, f) placing the substrate to be analysed on the substrate-carrier as described above, g) selecting the desired shim height from table T1 or, if using the micrometer screws, from another table, h) placing the collection liquid in the collection groove, preferably between the notches, i) mounting the substrate-carrier on the base, j) rotating the substrate-carrier at a constant speed selected based on the wetting/dewetting of the substrate, until the substrate has made one complete revolution. The speed of rotation is, for example, 1 revolution in approximately 2 minutes for a 200 mm silicon plate with native oxide and one revolution in approximately 4 minutes for a 300 mm silicon plate with native oxide.

The substrate may comprise a notch or a flat. Advantageously, the substrate is orientated so that the collection starts at the notch or at the flat. Thus, there is a mark for knowing when one complete revolution has been carried out, and simultaneously images are acquired of the collection, either continuously or by taking photographs at regular or irregular intervals.

k) removing the substrate and the substrate support, l) recovering the collection liquid.

Step c) can be carried out as follows, a calibration substrate is disposed on the device, having selected beforehand the operating conditions from the charts. The visualisation means are calibrated using the calibration substrate, such that the contrast and the visualisation of the graduations is satisfactory. The presence of a liquid droplet in the groove is not required for this calibration of the visualisation means.

As a variant, a graduated transparent pellet representing the graduations of the calibration disc can be placed in front of the lens, for example at the transparent disc 25, or an image comprising the graduations can be superimposed on an image of the droplet which wets the surface of the plate; in this case, steps a) to d) are not carried out.

As a variant again, when the device comprises micrometer screws, a graduated transparent pellet comprising the graduations of the calibration disc is disposed in front of the lens of the camera, so that the graduations appear directly on the images and/or the film. The operator can then manipulate the micrometer screws in order to place the plate at the position corresponding to the desired collection height while directly visualising the position of the plate with respect to the graduations carried by the target. As a variant, the graduations appear on the screen using the visualisation software. Preferably, the substrate is placed at a raised height and is then lowered until attaining the desired liquid height on the substrate.

Preferably, one or more blanks of the collection groove is or are produced before placing the collection liquid droplet in step h). For this, a liquid droplet is placed in the collection groove and is then recovered for an analysis. The results will be deducted from those of the analysis of the droplets having served for the collection.

The droplet that was used for the collection is then analysed, for example by ICP-MS. The analysis is both quantitative and qualitative, and the analysis results make it possible to identify the contaminants collected and the quantity of these contaminants in µg/L or mass-ppb (parts per billion).

It is desired to convert these results to at/cm², the units generally used in microelectronics for metallic contamination.

The collection surface area is therefore calculated by processing the images acquired during the collection.

For example, the photograph of the calibration substrate is processed by carrying out a thresholding by means of a suitable software, in order to recover only the graduations forming a target which is applied on the collection images. The adjustments of the visualisation means, and optionally those of the adjustment means, during the acquisition of the target, are those used during the collection.

As a variant, a mask is produced from the image of the calibration substrates captured in step c). This mask is then superimposed on the images acquired during the collection.

The positioning of the target takes into account the shim height applied for the collection.

It is then possible to measure the wetting height and the dewetting height on each image and to deduce from these the collection height.

The total surface area of collection, comprising the areas of the two substrate edges and the bevel, is calculated using equation (I).

The concentration is then calculated by using the equation:

$$C = \frac{V \times c \times 0.000001 \times N_A}{M \times S} \quad (II)$$

where C=concentration in at/cm², V=volume of solution to be analysed (L), c=concentration (µg/L), $N_A$=Avogadro's number ($6.02 \times 10^{23}$ at.mol$^{-1}$), M=molar mass of the element analysed (g/mol) and S=scanned surface area (cm²).

By way of example, it is possible to use one collection solution for the noble metals and one collection solution for the standard elements (all the elements of the periodic table which are not noble metals).

It is possible to carry out the two collections successively. Preferably, the collection of standard elements takes place before the collection of the noble metals (ruthenium (Ru), rhodium (Rh), palladium (Pd), silver (Ag), iridium (Ir), platinum (Pt), gold (Au) and osmium (Os).

For example, for the collection of noble metals, a solution is used which is prepared from 37% hydrochloric acid, 69.5% nitric acid and 49% hydrofluoric acid. The collection of standard elements can be carried out using a solution prepared from 38% hydrochloric acid and 35% oxygenated water.

Results are presented below demonstrating the effectiveness of the method for qualitatively detecting contaminants on the bevel of wafers. To do this, two silicon wafers with native oxide are analysed, one dipped in an $H_3PO_4$ bath containing metal species and the other in an $H_2C_2O_4$ bath also containing metals species.

In these examples, the collection height has been selected to be low, in order to achieve a collection of contaminants essentially on the bevel (bevel) only. A shim height of 3.35 mm giving a wetting height of 2.2 mm was selected from table T1.

The collection on each of the substrates was carried out following steps a) to k) described above and the collection droplet was analysed by ICP-MS.

Table T2 below lists the contaminants and their quantity in ppb for each plate (line $H_3PO_4$ (ppb) and $H_2C_2O_4$ (ppb)).

TABLE T2

| Elements | Na | Mg | Al | Ca | Ti | V | Cr |
|---|---|---|---|---|---|---|---|
| $H_3PO_4$ (ppb) | 0.85 | ND | ND | 0.55 | 0.03 | 0.01 | 0.03 |
| $H_2C_2O_4$ (ppb) | ND | 0.14 | 2.55 | 0.14 | 0.08 | ND | 0.09 |
| LLD ICPMS (ppb) | 0.1129 | 0.0044 | 0.0305 | 0.0654 | 0.0138 | 0.0034 | 0.0140 |
| MM | 22.9000 | 24.3 | 26.9 | 40 | 47.8 | 50.9 | 52 |
| At/cm² $H_3PO_4$ bevel | 1.16E+12 | ND | ND | 4.30E+11 | 1.97E+10 | 6.12E+09 | 2.04E+10 |
| At/cm² $H_2C_2O_4$ bevel | ND | 1.82E+11 | 2.95E+12 | 1.06E+11 | 4.92E+10 | ND | 5.46E+10 |

| Elements | Mn | Fe | Ni | Co | Cu | Zn | Mo |
|---|---|---|---|---|---|---|---|
| $H_3PO_4$ (ppb) | ND | ND | 0.03 | ND | 0.03 | 0.08 | 0.07 |
| $H_2C_2O_4$ (ppb) | 0.06 | 2.45 | 0.32 | 0.00 | 0.31 | 0.13 | 0.02 |
| LLD ICPMS2 (ppb) | 0.0005 | 0.0180 | 0.0004 | 0.0020 | 0.0040 | 0.0257 | 0.0135 |
| MM | 24.9 | 55.8 | 58.6 | 58.9 | 63.5 | 65.3 | 95.9 |
| At/cm² $H_3PO_4$ bevel | ND | ND | 1.39E+10 | ND | 1.54E+10 | 3.66E+10 | 2.15E+10 |
| At/cm² $H_2C_2O_4$ bevel | 7.74E+10 | 1.37E+12 | 1.69E+11 | 0.00E+00 | 1.50E+11 | 6.01E+10 | 5.13E+09 |

ND: not detected
LLD: Low Limit of Detection.
Here MM is the molar mass of the analysed element.

In the advantageous embodiment using a motorised system for rotating the substrate-carrier, all of the collection can be highly advantageously controlled by the control and processing unit U, using a software which controls the start and stop of the collection with respect to the notch or the flat and which triggers the recording of images of the collection and retrieves the images. The notch or the flat is detected, for example, by analysing the images provided by the visualisation means.

This software can also provide the processing of images in order to automatically calculate the collection height and therefore the collected surface area, and also enables calculation of the concentration of metals, once the quantitative and qualitative analysis of the collection droplet has been carried out.

In addition, the control and processing unit can also control the position of the substrate-carrier, for example by using a motorised micrometer screw, after having selected the collection height taking into account, for example, the nature of the plate used, the collection solution and/or the desired collection type, i.e. a collection on approximately the bevel only, or on the bevel and the edges.

Advantageously, the control and processing unit can be configured to stop the descent of the substrate when contact is detected between the plate and the droplet, for example by real-time analysis of the images provided by the visualisation means.

In the described example, the analysed wafers are initially hydrophilic and the collection solution makes the collection region hydrophobic. It will be understood that the collection can be carried out directly on a plate having hydrophobic properties, the collection solution then being adapted.

In the described example, during the collection the plate is rotated about a horizontal axis. As a variant, it is rotated about an inclined axis, enabling, for example, the collection surface area on the front face or the rear face to be reduced.

The invention claimed is:

1. A collection device for collecting elements on at least one bevel of a circular plate, the collection device comprising:
   a base comprising a collection groove to receive a collection liquid;
   a plate-carrier configured to rotate the plate about itself and such that an outer periphery of the plate penetrates into the collection groove; and
   means for visualising an interior of the collection groove, enabling at least one image to be acquired of a contact region between the collection liquid and at least one of two faces of the plate.

2. The collection device according to claim 1, wherein the visualisation means comprise at least one camera connectable to means for display and processing of images.

3. The collection device according to claim 2, wherein the base comprises a bore opening into the groove, in which a camera is mounted.

4. The collection device according to claim 3, wherein
   the visualisation means is configured to acquire at least one image of the contact region between the collection liquid and the two faces of the plate, and
   the base comprises another bore opening into the groove, opposite the bore, and in which another camera is mounted.

5. The collection device according to claim 1, further comprising illumination means orientated so as to light the collection groove from above.

6. The collection device according to claim 1, further comprising means for modifying a penetration position of the plate into the collection groove.

7. The collection device according to claim 6, wherein the means for modifying the penetration position of the plate into the collection groove comprise a set of shims of different thicknesses disposable between the plate-carrier and the base.

8. The collection device according to claim 6, wherein the means for modifying the penetration position of the plate into the collection groove comprise micrometer screws.

9. The collection device according to claim 1, wherein a bottom of the collection groove comprises a modification of curvature of the bottom of the groove to keep the collection liquid in position.

10. The collection device according to claim 1, further comprising means for rotating the plate-carrier so as to rotate the plate about its axis over at least 360° at constant speed.

11. The collection device according to claim 1, further comprising means for delivering a controlled gas flow in the collection groove in the collection region, directed opposite to wetting of an edge of the plate by the collection liquid.

12. Collection A collection system comprising:
   the collection device according to claim 1; and
   a processing unit configured to control a penetration position of the plate into the collection groove, a speed of rotation and the rotation, and configured to process images provided by the visualisation means in order to determine a collection surface area.

13. A collection method using a collection device that includes
   a base comprising a collection groove to receive a collection liquid,
   a plate-carrier configured to rotate a plate about itself and such that an outer periphery of the plate penetrates into the collection groove, and
   means for visualising an interior of the collection groove, enabling at least one image to be acquired of a contact region between the collection liquid and at least one of two faces of the plate, the method comprising:
   A) placing the plate on the plate-carrier;
   B) placing the collection liquid in the collection groove
   C) placing the plate-carrier such that the plate penetrates into the collection liquid to a given depth;
   D) rotating the plate at a suitable constant speed over at least one complete revolution, and acquiring collection images;
   E) withdrawing the plate; and
   F) recovering the collection liquid.

14. The collection method according to claim 13, further comprising, prior to A), placing, on the plate-carrier, a graduated plate having a same diameter as the plate on which it is desired to collect elements, and comprising graduations extending radially from a outer edge of the graduated plate, acquiring an image of the graduated plate and processing said image of the graduated plate, to process the images acquired during the collection.

15. The collection method according to claim 14, wherein the suitable constant speed of rotation is determined during rotation of a calibration plate.

16. The collection method according to claim 13, wherein graduations are superimposed on the collection images so that the graduations extend radially from an outer edge of the plate.

17. The collection method according to claim 14, the elements to be collected comprising standard elements and noble metals, said collection method comprising collecting standard elements using a first collection liquid followed by collecting noble metals using a second collection liquid.

18. A method for establishing at least one chart of a collection height using a collection device, which includes
- a base comprising a collection groove to receive a collection liquid,
- a plate-carrier configured to rotate a plate about itself and such that an outer periphery of the plate penetrates into the collection groove, and
- means for visualising an interior of the collection groove, enabling at least one image to be acquired of a contact region between the collection liquid and at least one of two faces of the plate, based on a penetration depth of the plate into the collection groove and of a volume of the collection liquid, the method comprising:

A'): mounting a calibration plate on the plate-carrier, the calibration plate having surface condition properties of wafers on which to collect elements and having a same diameter as the wafers and comprising graduations extending radially at least from an outer edge of the calibration plate;

B'): placing the collection liquid in the collection groove;

C'): placing the plate-carrier carrying the calibration plate such that the calibration plate penetrates into the collection liquid to a given penetration depth;

D'): acquiring images;

then repeating C' and D' while modifying the penetration depth of the calibration plate into the collection groove E') determining a collection height and calculating a collection surface area for various penetration depths; and F') establishing a chart connecting the penetration depth with the volume of the collection liquid at the collection surface.

19. A method for determining a concentration per unit area of metallic contaminants of a plate using the collection method according to claim 13, and comprising processing the images acquired in D to determine a collection surface area, analysing the collection liquid and calculating surface concentration of contaminants of the plate.

* * * * *